(12) United States Patent
Mamitsu

(10) Patent No.: US 7,573,687 B2
(45) Date of Patent: Aug. 11, 2009

(54) POWER SEMICONDUCTOR DEVICE

(75) Inventor: Kuniaki Mamitsu, Okazaki (JP)

(73) Assignee: DENSO CORPORATION, Kariya (JP)

( * ) Notice: Subject to any disclaimer, the term of this patent is extended or adjusted under 35 U.S.C. 154(b) by 87 days.

(21) Appl. No.: 11/984,574

(22) Filed: Nov. 20, 2007

(65) Prior Publication Data

US 2008/0117557 A1    May 22, 2008

(30) Foreign Application Priority Data

| Nov. 21, 2006 | (JP) | .............................. | 2006-314054 |
| Aug. 29, 2007 | (JP) | .............................. | 2007-222813 |

(51) Int. Cl.
*H02H 3/22*    (2006.01)

(52) U.S. Cl. ........................................ 361/56; 361/111
(58) Field of Classification Search ................... 361/56, 361/91.1, 111; 327/108
See application file for complete search history.

(56) References Cited

U.S. PATENT DOCUMENTS

| 5,502,399 | A |   | 3/1996  | Imai |
| 5,536,958 | A | * | 7/1996  | Shen et al. ................... 257/356 |
| 5,736,779 | A | * | 4/1998  | Kobayashi ................... 257/603 |
| 5,828,081 | A | * | 10/1998 | Yoshida et al. ................ 257/48 |
| 6,208,011 | B1 | * | 3/2001 | Yasuda ........................ 257/551 |
| 6,218,889 | B1 |  | 4/2001 | Fujiki et al. |

FOREIGN PATENT DOCUMENTS

| JP | A-5-67661   | 3/1993  |
| JP | A-7-142771  | 6/1995  |
| JP | A-11-340459 | 12/1999 |
| JP | S-2006-314054 | 11/2006 |

* cited by examiner

*Primary Examiner*—Danny Nguyen
(74) *Attorney, Agent, or Firm*—Posz Law Group, PLC

(57) ABSTRACT

A power semiconductor device includes a power semiconductor element, a protection circuit, an inspection terminal, and an electrical conductor. The protection circuit includes multiple zener diodes connected in series between a gate and an emitter of the power semiconductor element. The protection circuit limits a voltage between the gate and emitter of the power semiconductor element, when an abnormal voltage is applied to the gate. The electrical conductor electrically connects the inspection terminal to a node between the zener diodes of the protection circuit. The zener diodes are separately inspected by using the inspection terminal.

13 Claims, 11 Drawing Sheets

POWER SEMICONDUCTOR DEVICE

CROSS REFERENCE TO RELATED APPLICATION

This application is based on and incorporates herein by reference Japanese Patent Applications No. 2006-314054 filed on Nov. 21, 2006 and No. 2007-222813 filed on Aug. 29, 2007.

FIELD OF THE INVENTION

The present invention relates to a power semiconductor device that includes a power semiconductor element.

BACKGROUND OF THE INVENTION

In a screening inspection of a power semiconductor device including a power semiconductor element such as a power metal oxide semiconductor field-effect transistor (MOSFET) or an insulated-gate bipolar transistor (IGBT), a screening voltage is applied to a gate terminal of the power semiconductor element to inspect an electrical isolation of a gate oxide film of the power semiconductor element. The screening voltage is set greater than a gate breakdown voltage rating of the power semiconductor element.

As disclosed, for example, in JP-A-H5-67661, U.S. Pat. No. 5,502,399 corresponding to JP-A-H7-142711, or U.S. Pat. No. 5,828,081 corresponding to JP-A-H7-283370, a power semiconductor device has been proposed that has a terminal for receiving an inspection signal and switches to an inspection mode in response to the inspection signal. Thus, a screening inspection can be conducted effectively.

As disclosed, for example, in U.S. Pat. No. 6,218,889 corresponding to JP-A-H11-177087, a power semiconductor device has been proposed that has a protection circuit constructed with a zener diode to protect a power semiconductor element from static electricity damage.

In the power semiconductor device disclosed in U.S. Pat. No. 6,218,889, an inspection of the protection circuit must be conducted in addition to a screening inspection of a power semiconductor element. If a protection voltage (i.e., zener voltage) of the protection circuit is set greater than a screening voltage, a voltage greater than the screening voltage is applied to a gate electrode of the power semiconductor element during the inspection of the protection circuit. As a result of the inspection of the protection circuit, the gate electrode of the power semiconductor element deteriorates. The power semiconductor devices disclosed in JP-A-H5-67661, U.S. Pat. Nos. 5,502,399, and 5,828,081 are not directed to reduce the deterioration resulting from the inspection of the protection circuit.

SUMMARY OF THE INVENTION

In view of the above-described problem, it is an object of the present invention to provide a power semiconductor device having a structure that helps prevent a gate electrode of a power semiconductor element from deteriorating due to an inspection of a protection circuit.

A power semiconductor device includes a power semiconductor element, a protection circuit, first through fourth external terminals, and an electrical conductor. The power semiconductor element has a gate electrode, a first electrode, and a second electrode. The power semiconductor element allows a first electric current to flow from the first electrode to the second electrode in accordance with an electrical signal applied to the gate electrode. The protection circuit includes a plurality of protection elements connected in series between the gate electrode and the second electrode of the power semiconductor element. The protection circuit limits a voltage between the gate electrode and the second electrode, when an abnormal voltage is applied to the gate electrode. The first external terminal is connected to the gate electrode of the power semiconductor element. The second external terminal is connected to the first electrode the power semiconductor element. The third external terminal is connected to the second electrode of the power semiconductor element. The fourth external terminal is available to separately inspect the plurality of protection elements of the protection circuit. The electrical conductor electrically connects the fourth external terminal to a node between a first one of the plurality of protection elements and a second one of the plurality of protection elements.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
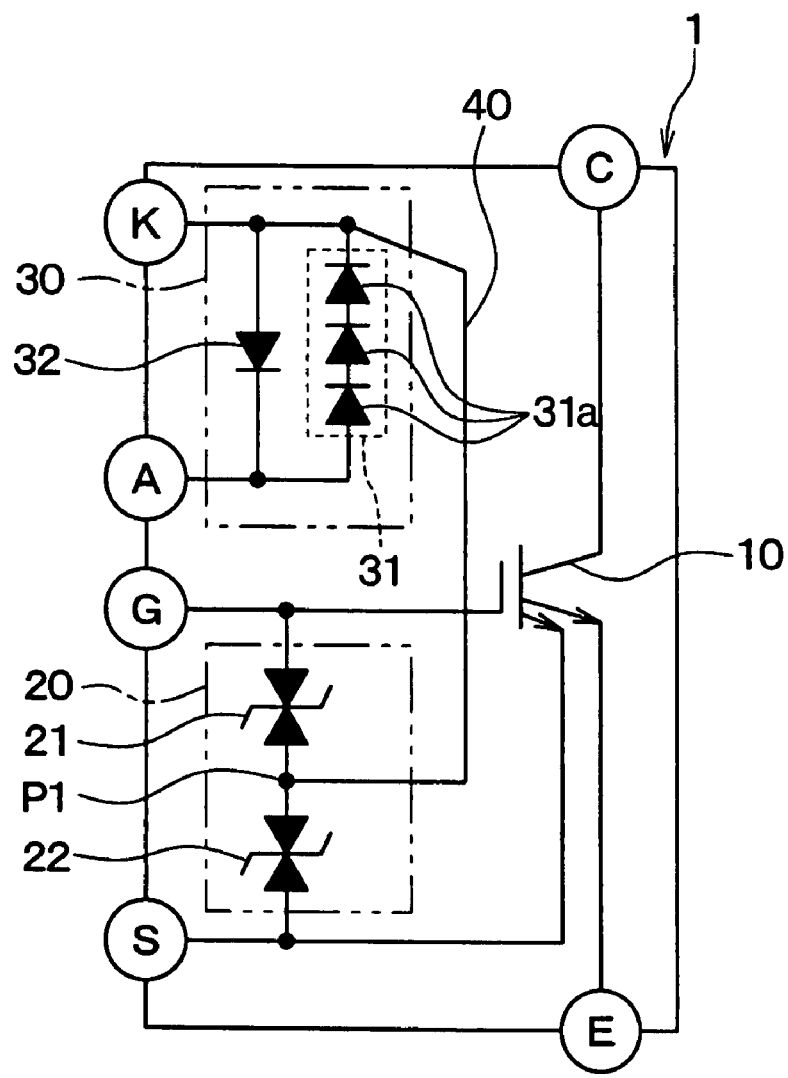
FIG. 1 is a diagram illustrating a power semiconductor device according to a first embodiment of the present invention.

Referring to FIG. 1, a power semiconductor device 1 according to a first embodiment of the present invention includes an insulated gate bipolar transistor (IGBT) 10 as a power semiconductor element, a protection circuit 20, and a temperature detection circuit 30 as a peripheral circuit. The power semiconductor device 1 has a plurality of external terminals arranged along an outer shape of the power semiconductor device 1. Electrical signals are transmitted between the power semiconductor device 1 and external devices through the external terminals. The external terminals include a gate terminal G, a collector terminal C, an emitter terminal E, a current sensing terminal S, an anode terminal A, and a cathode terminal K.

The IGBT 10 has first and second emitter electrodes and is constructed as a current mirror circuit. The first and second emitter electrodes of the IGBT 10 are connected to the emitter terminal E and the current sensing terminal S, respectively. Gate and collector of the IGBT 10 are connected to the gate and collector terminals G, C, respectively.

The IGBT 10 is constructed with a plurality of cells, and an electric current flowing through the IGBT 10 depends on the number of the cells. First and second areas of first and second circuits, which pass first and second electric currents through the first and second emitter electrodes respectively, are proportional to the number of the cells. In the present embodiment, a current ratio between the first and second electric currents is set to 1:10000 so that the first current is ten thousand times the second current. Accordingly, an area ratio between the first and second areas of the first and second circuits is set to 1:10000.

The protection circuit 20 is connected between the gate terminal G and the current sensing terminal S. When an abnormal voltage such as a static electricity is applied to the gate terminal G, the protection circuit 20 protects the IGBT 10 from the abnormal voltage by limiting a voltage between the gate terminal G and the current sensing terminal S.

In the IGBT 10, since the second current flowing through the second emitter electrode is smaller than the first current flowing through the first emitter electrode, the second area of the second circuit passing the second current through the second emitter electrode is smaller than the first area of the first circuit passing the first current through the first emitter electrode. Due to the small area, the second circuit is likely to be broken by the abnormal voltage applied to the gate terminal G, as compared to the first circuit. Therefore, the protection circuit 20 is connected between the gate terminal G, which is connected to the gate electrode of the IGBT 10, and the current sensing terminal S, which is connected to the second emitter electrode of the IGBT 10.

The protection circuit 20 includes zener diodes 21, 22 connected in series. The zener diodes 21, 22 have zener voltage $Vz1$, $Vz2$, respectively. The protection circuit 20 also can act as a clamp circuit having a clamp voltage $Vz1+Vz2$. When the abnormal voltage is applied to the gate terminal G, a gate voltage of the IGBT 10 is clamped to the clamp voltage $Vz1+Vz2$. The zener voltages $Vz1$, $Vz2$ are set approximately equal to each other.

The temperature detection circuit 30 is arranged near the IGBT 10 to detect a temperature anomaly of the IGBT 10. The temperature detection circuit 30 includes a temperature detection diode 31 and a protection diode 32. The temperature detection diode 31 is constructed with a plurality of diode members 31a connected in series. An anode of the temperature detection diode 31 is connected to the anode terminal A, and a cathode of the temperature detection diode 31 is connected to the cathode terminal K. A voltage between the anode and cathode terminals A, K depends on a temperature of the temperature detection diode 31. The protection diode 32 is connected in parallel to the temperature detection diode 31 to protect the temperature detection diode 31.

The power semiconductor device 1 has a conductor 40 that electrically connects a node P1 between the zener diodes 21, 22 to the cathode terminal K.

The circuit elements and the external terminals of the power semiconductor device 1 are electrically connected to each other through conductive patterns formed on a semiconductor substrate. The conductive patterns may be, for example, made of aluminum (Al), aluminum silicon alloy (AlSi), copper (Cu), or the like. The conductor 40 is a portion of the conductive patterns.

An inspection equipment used in an inspection of the power semiconductor device 1 includes a variable voltage power source 100, an ammeter 110, and a voltmeter 120.

The protection circuit 20 in the power semiconductor device 1 is inspected in the following manner. In the present embodiment, the protection circuit 20 is separately inspected by using the conductor 40 and the cathode terminal K. Specifically, the zener diodes 21, 22 of the protection circuit 20 are separately inspected by using the conductor 40 and the cathode terminal K.

Figure 2:
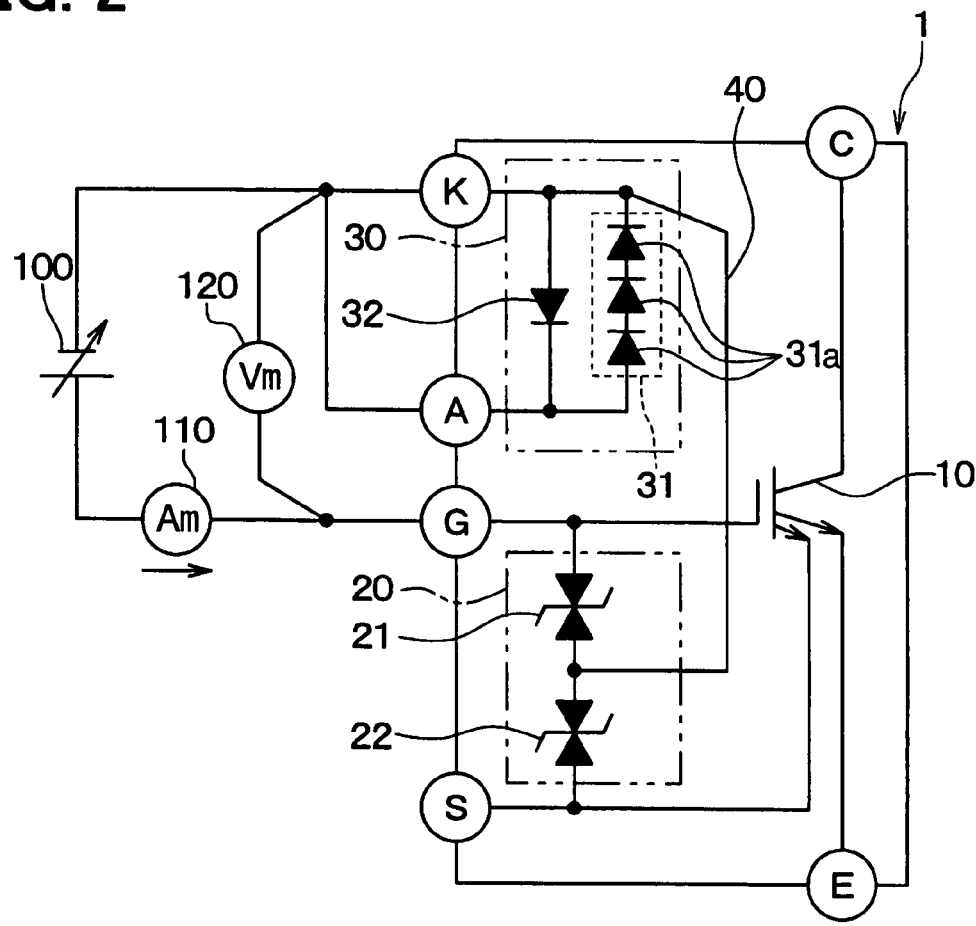
FIG. 2 is a diagram illustrating a connection between the power semiconductor device and an inspection equipment when a first zener diode of the power semiconductor device is inspected.

As shown in FIG. 2, when the zener diode 21 of the protection circuit 20 is inspected, the variable voltage power source 100 and the ammeter 110 are connected in series between the cathode terminal K and the gate terminal G. The voltmeter 120 is connected between the cathode terminal K and the gate terminal G. The cathode and anode terminals K, A are connected together to be short-circuited.

In the inspection of the zener diode 21, while current and voltage readings of the ammeter 110 and voltmeter 120 are monitored, an inspection voltage applied between the gate and cathode terminals G, K is gradually increased from 0 volts by increasing an output voltage of the variable voltage power source 100. Thus, a relationship between the current reading (i.e., inspection current) of the ammeter 110 and the voltage reading (i.e., inspection voltage) of the voltmeter 120 is measured.

Figure 3:
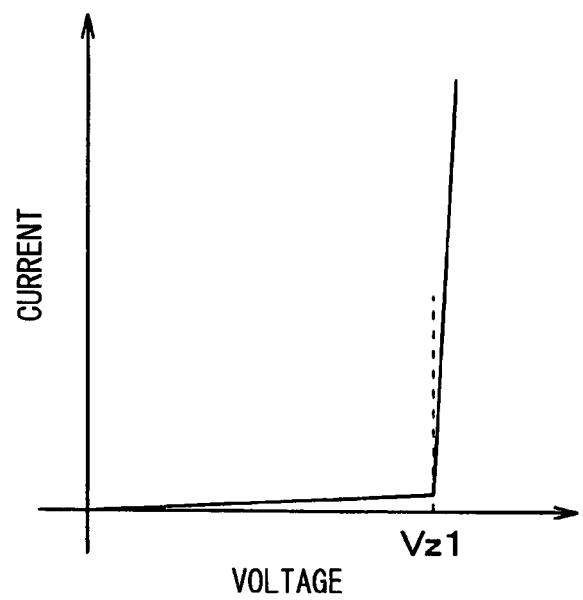
FIG. 3 is a graph illustrating a relationship between a voltage and a current when the first zener diode is inspected.

FIG. 3 illustrates a graph showing the relationship between the inspection current and the inspection voltage observed when the zener diode 21 is inspected. As can be seen from FIG. 3, the inspection current gradually increases with an increase in the inspection voltage until the inspection voltage reaches the zener voltage $Vz1$ of the zener diode 21. When the inspection voltage exceeds the zener voltage $Vz1$, a breakdown current flows through the zener diode 21. As a result, the inspection current increases sharply. When the sharp increase in the inspection current is observed, the variable voltage power source 100 is stopped, and the inspection of the zener diode 21 is finished.

If the relationship shown in FIG. 3 is observed, the zener diode 21 is determined as nondefective. In contrast, if the relationship shown in FIG. 3 is not observed, the zener diode 21 is determined as defective.

Figure 4:
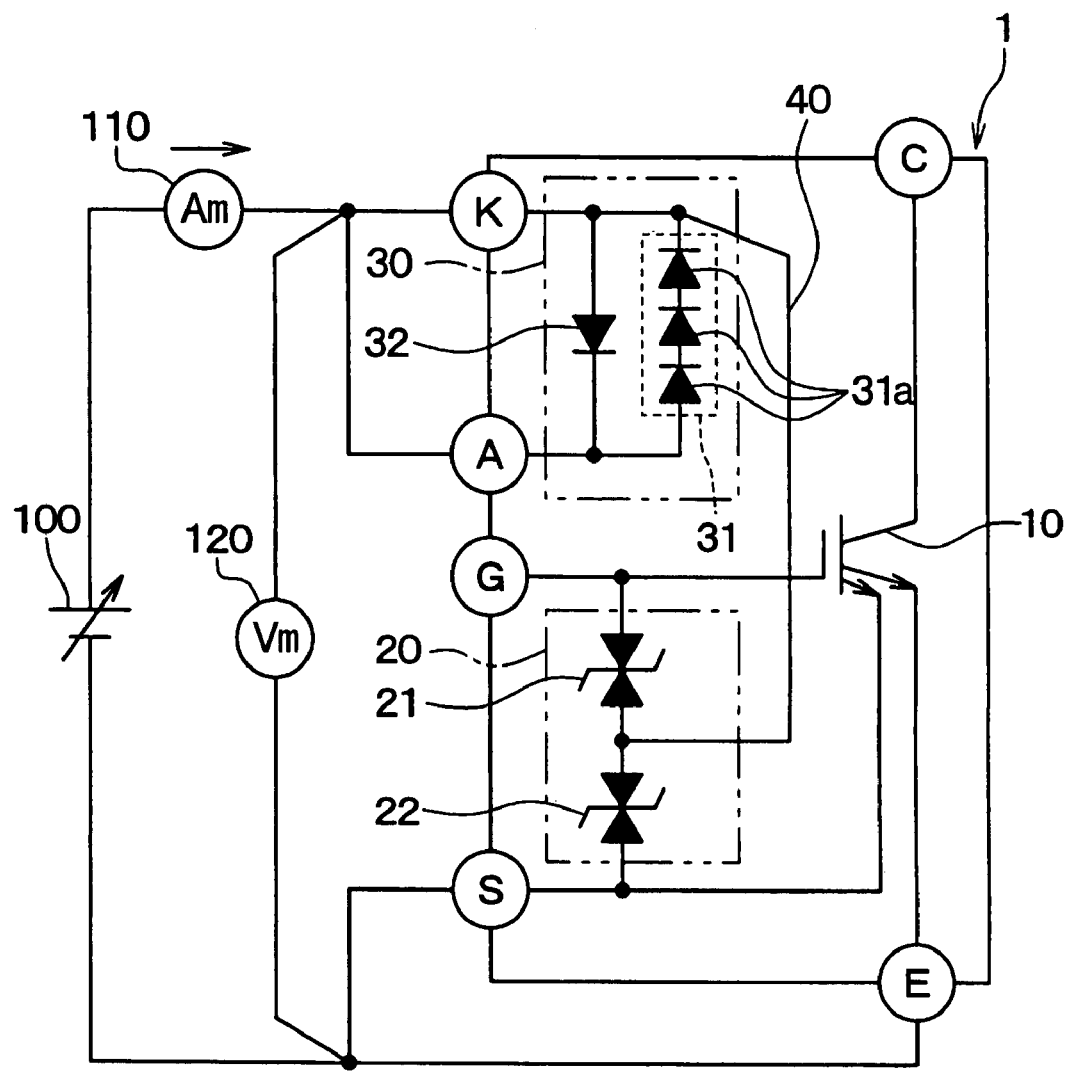
FIG. 4 is a diagram illustrating a connection between the power semiconductor device and the inspection equipment when a second zener diode of the power semiconductor device is inspected.

As shown in FIG. 4, when the zener diode 22 of the protection circuit 20 is inspected, the variable voltage power source 100 and the ammeter 110 are connected in series between the cathode terminal K and the emitter terminal E. The voltmeter 120 is connected between the cathode terminal K and the emitter terminal E. The cathode terminal K and the anode terminal A are connected together to be short-circuited, and the emitter terminal E and the current sensing terminal S are connected together to be short-circuited.

In the inspection of the zener diode 22, while the current and voltage readings of the ammeter 110 and voltmeter 120 are monitored, the inspection voltage applied between the gate and cathode terminals G, K is gradually increased from 0 volt by increasing the output voltage of the variable voltage power source 100. Thus, the relationship between the current reading (i.e., inspection current) of the ammeter 110 and the voltage reading (i.e., inspection voltage) of the voltmeter 120 is measured.

Figure 5:
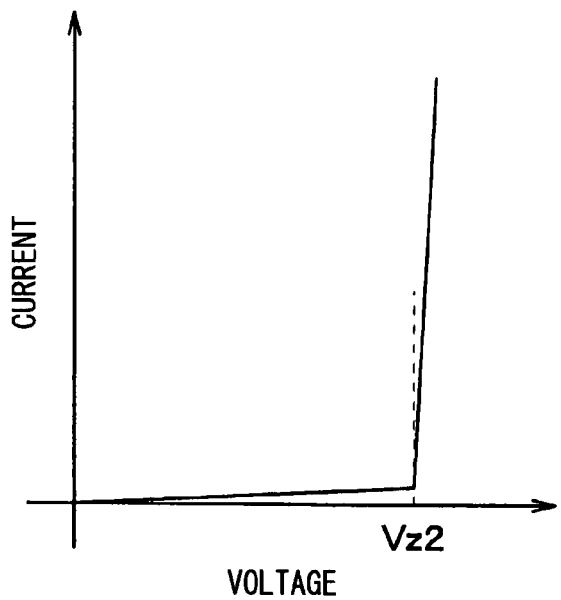
FIG. 5 is a graph illustrating a relationship between a voltage and a current when the second zener diode is inspected.

FIG. 5 illustrates a graph showing the relationship between the inspection voltage and the inspection current observed when the zener diode 22 is inspected. As can be seen from FIG. 5, the inspection current gradually increases with the increase in the inspection voltage until the inspection voltage reaches the zener voltage Vz2 of the zener diode 22. When the inspection voltage exceeds the zener voltage Vz2, the breakdown current flows through the zener diode 22. As a result, the inspection current increases sharply. When the sharp increase in the inspection current is observed, the variable voltage power source 100 is stopped, and the inspection of the zener diode 22 is finished.

When the relationship shown in FIG. 5 is observed, the zener diode 22 is determined as nondefective. In contrast, the relationship shown in FIG. 5 is not observed, the zener diode 22 is determined as defective.

Figure 6:
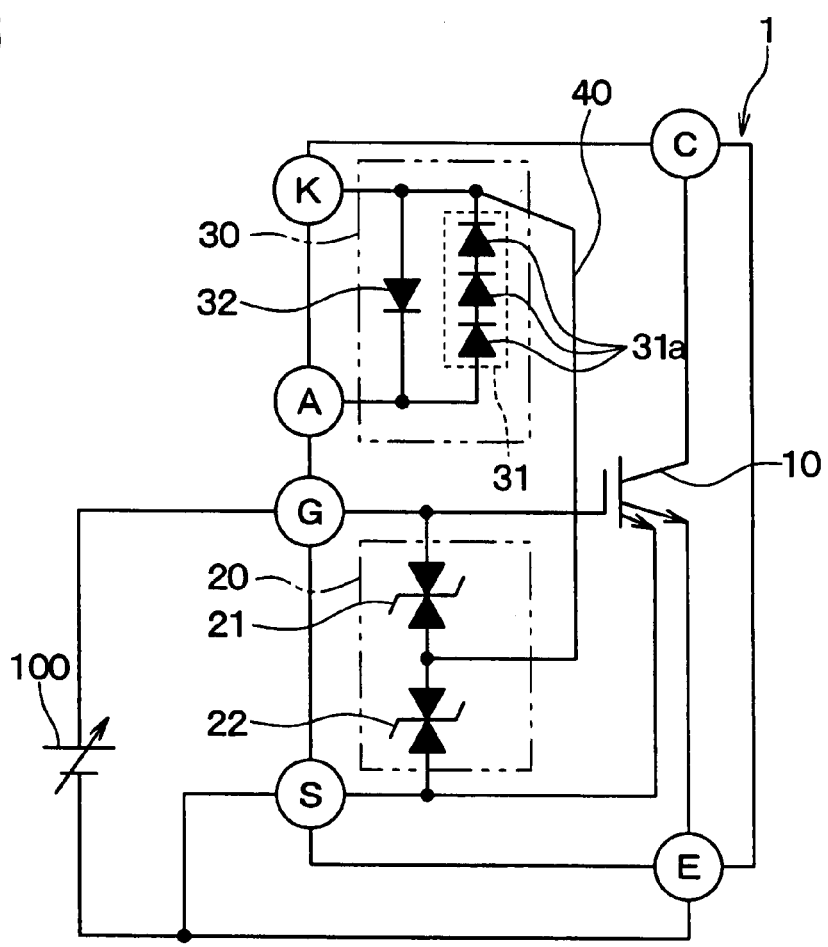
FIG. 6 is a diagram illustrating a connection between the power semiconductor device and the inspection equipment when a screening inspection of inspecting an electrical isolation of a gate oxide film of a power semiconductor element of the power semiconductor device is conducted.

A screening inspection of the IGBT 10 is conducted in the following manner to inspect an electrical isolation of a gate oxide film of the IGBT 10. As shown in FIG. 6, the variable voltage power source 100 is connected between the gate and emitter terminals G, E. The current sensing terminal S and the emitter terminal E are connected together to be short-circuited. Each of the cathode terminal K and the anode terminal A is open-circuited.

In the screening inspection of the IGBT 10, the variable voltage power source 100 outputs a constant voltage for a certain period of time (e.g., a few seconds) so that a screening voltage Vcs having a predetermined level is applied to the gate electrode of the IGBT 10.

The screening voltage Vcs is set less than the clamp voltage Vz1+Vz2, i.e., Vcs<Vz1+Vz2. For example, when a gate breakdown voltage rating of the IGBT 10 is 20 volts (V), the screening voltage Vcs is set between about 40 V and 50 V, and each of the zener voltages Vz1, Vz2 is set to about 30 V. In such an approach, the inspection voltage, which is applied to the gate electrode of the IGBT 10 when each inspection of the zener diodes 21, 22 is performed, can be less than the screening voltage Vcs and slightly greater than each of the zener voltages Vz1, Vz2. Specifically, when each of the zener voltages Vz1, Vz2 is set to about 30 V, the zener diodes 21, 22 can be inspected by using the inspection voltage ranging from 0 V to about 35 V.

As described above, according to the first embodiment, the node P1 between the zener diodes 21, 22 of the protection circuit 20 is electrically connected to the cathode terminal K through the conductor 40. The zener diodes 21, 22 of the protection circuit 20 are separately inspected by using the conductor 40 and the cathode terminal K. In such an approach, the inspection voltage, which is applied to the gate electrode of the IGBT 10 when the protection circuit 20 is inspected, can be less than the screening voltage Vcs. The inspection voltage applied to the gate electrode of the IGBT 10 during the inspection of the protection circuit 20 is close to the gate breakdown voltage rating of the IGBT 10. Thus, the gate electrode of the IGBT 10 can be prevented from deteriorating due to the inspection of the protection circuit 20.

The cathode terminal K, which is used when the protection circuit 20 is separately inspected, is shared with the temperature detection circuit 30. Thus, the protection circuit 20 can be separately inspected without an additional specific terminal. Instead of the cathode terminal K, the anode terminal A can be used to separately inspect the protection circuit 20.

The circuit elements such as the IGBT 10 and the protection circuit 20 are electrically connected to each other through conductive patterns formed on the semiconductor substrate of the power semiconductor device 1. The conductive patterns include a polysilicon member that forms a gate wiring of the IGBT 10. The conductor 40 is a portion of the conductive patterns. In such an approach, the conductor 40 can be formed without an additional specific manufacturing process.

The protection circuit 20 can be constructed with one zener diode or more than two zener diodes. The zener voltages Vz1, Vz2 of the zener diodes 21, 22 are set approximately equal to each other. Thus, the inspection voltage applied to the gate electrode of the IGBT 10 during the inspection of the protection circuit 20 can be effectively reduced.

The screening voltage Vcs required to perform the screening inspection of the IGBT 10 is set less than the clamp voltage Vz1+Vz2. In such an approach, the screening voltage Vcs can be applied to the gate electrode of the IGBT 10 during the screening inspection.

Second Embodiment

Figure 7:
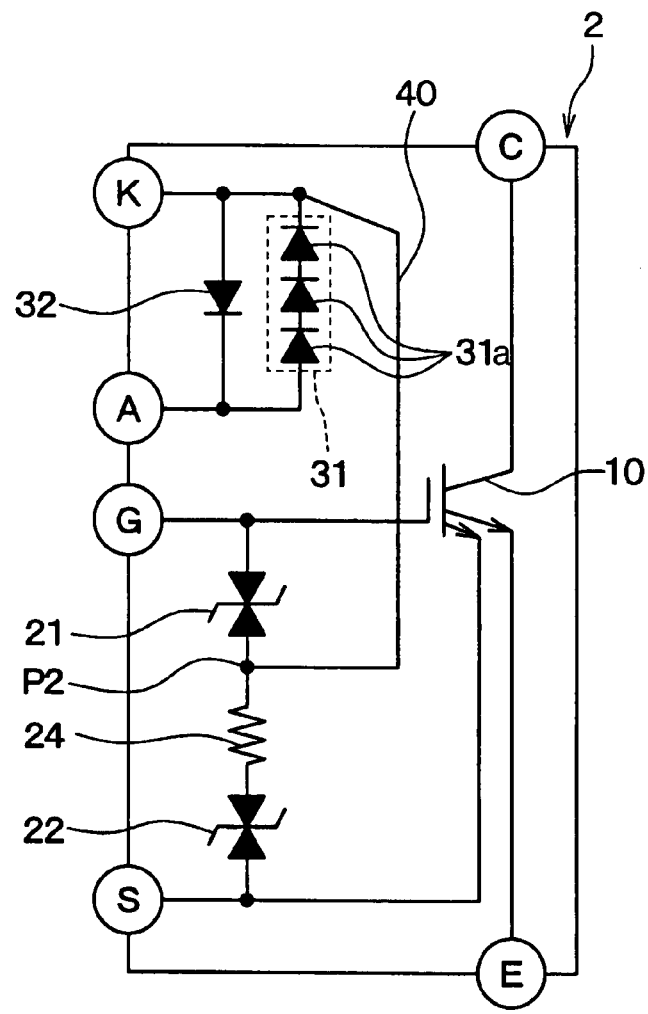
FIG. 7 is a diagram illustrating a power semiconductor device according to a second embodiment of the present invention.

A power semiconductor device 2 according to a second embodiment of the present invention is described below with reference to FIG. 7. Differences between the power semiconductor devices 1, 2 are as follows:

In the second embodiment, a protection circuit 20 further includes a resistor 24 having a resistance R in addition to zener diodes 21, 22. The resistor 24 is connected in series between the zener diodes 21, 22. Unlike the first embodiment, a zener voltage Vz1 of the zener diode 21 is set greater than a zener voltage Vz2 of the zener diode 22.

A node P2 between the zener diode 21 and the resistor 24 is electrically connected to the cathode terminal K through a conductor 40. The protection circuit 20 is separately inspected by using the conductor 40 and the cathode terminal K. Specifically, the zener diode 21 is inspected separately from the resistor 24 and the zener diode 22.

The protection circuit 20 of the power semiconductor device 2 is inspected in the following manner. As can been seen from FIGS. 2, 4, in the first embodiment, the power semiconductor device 1 and the inspection equipment are connected in different manners between when the zener diode 21 is inspected and when the zener diode 22 is inspected. In contrast, in the present embodiment, the power semiconductor device 2 and the inspection equipment are connected in a same manner between when the zener diode 21 is inspected and when the zener diode 22 is inspected.

Figure 8:
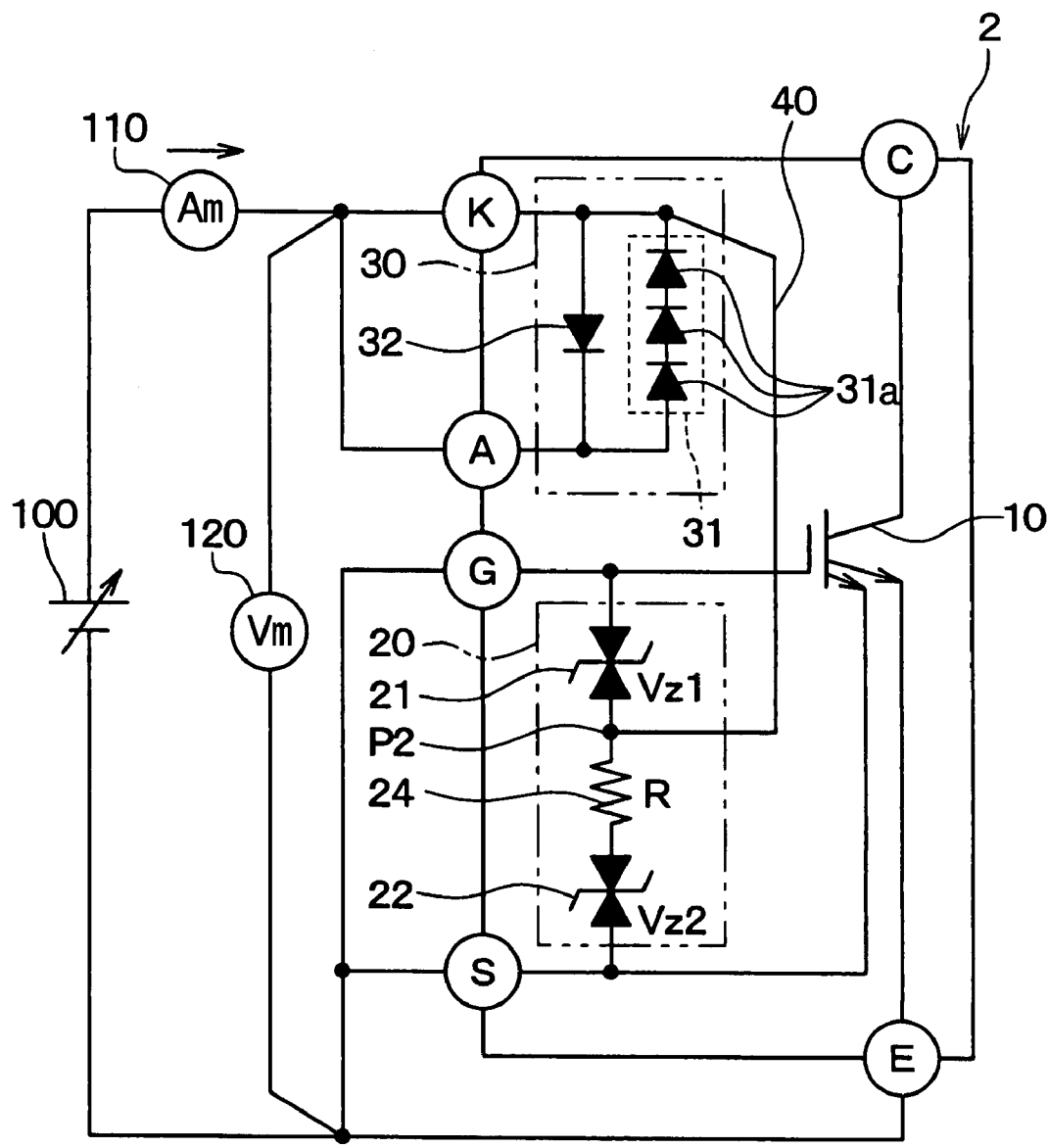
FIG. 8 is a diagram illustrating a connection between the power semiconductor device of FIG. 7 and the inspection equipment when first and second zener diodes of the power semiconductor device of FIG. 7 are inspected.

Specifically, the power semiconductor device 2 and the inspection equipment are connected in a manner shown in FIG. 8, when both the zener diodes 21, 22 are inspected. As shown in FIG. 8, the gate terminal G, the current sensing terminal S, and the emitter terminal E are connected together to be short-circuited. The variable voltage power source 100 and the ammeter 110 are connected in series between the cathode terminal K and the terminals G, S, E. The voltmeter 120 is connected between the cathode terminal K and the terminals G, S, E.

In the inspection of the zener diodes 21, 22, while the current and voltage readings of the ammeter 110 and voltmeter 120 are monitored, the inspection voltage applied between the gate and cathode terminals G, K is gradually increased from 0 volt by increasing the output voltage of the variable voltage power source 100. Thus, the relationship between the current reading (i.e., inspection current) of the ammeter 110 and the voltage reading (i.e., inspection voltage) of the voltmeter 120 is measured.

Figure 9:
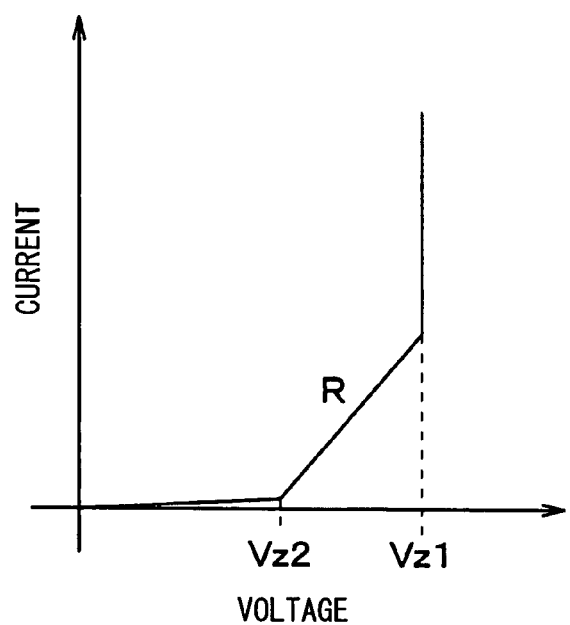
FIG. 9 is a graph illustrating a relationship between a voltage and a current when the first and second zener diodes of the power semiconductor device of FIG. 7 are inspected.

FIG. 9 illustrates a graph showing the relationship between the inspection voltage and the inspection current observed when both the zener diodes 21, 22 are inspected. As can be seen from FIG. 9, the inspection current gradually increases with the increase in the inspection voltage until the inspection voltage reaches the zener voltage Vz2 of the zener diode 22. When the inspection voltage exceeds the zener voltage Vz2, the inspection current increases sharply. Then, the inspection voltage exceeds the zener voltage Vz1, the inspection current increases more sharply. When the sharper increase in the inspection current is observed, the variable voltage power source 100 is stopped, and the inspections of the zener diodes 21,22 are finished.

When the relationship shown in FIG. 9 is observed, the zener diodes 21, 22 are determined as nondefective. In contrast, the relationship shown in FIG. 9 is not observed, the zener diodes 21, 22 are determined as defective.

As described above, according to the second embodiment, the protection circuit 20 includes the resistor 24 connected in series between the zener diodes 21, 22. The node P2 between the zener diode 21 and the resistor 24 is electrically connected to the cathode terminal K through the conductor 40. The zener diode 21 is inspected separately from the resistor 24 and the zener diode 22 by using the cathode terminal K. In such an approach, the zener diodes 21, 22 can be inspected based on the relationship between the inspection current and the inspection voltage appearing when the potential at the node P2 changes gradually. Therefore, the zener diodes 21, 22 can be inspected at a time without changing a connection between the power semiconductor device 2 and the inspection equipment.

According to the second embodiment, the zener voltage Vz1 of the zener diode 21 is set greater than the zener voltage Vz2 of the zener diode 22, and the node P2 between the zener diode 21 and the resistor 24 is electrically connected to the cathode terminal K through the conductor 40. Alternatively, the zener voltage Vz1 of the zener diode 21 can be set less than the zener voltage Vz2 of the zener diode 22. In this case, a node between the resistor 24 and the zener diode 22 is electrically connected to the cathode terminal K through the conductor 40.

Third Embodiment

Figure 10:
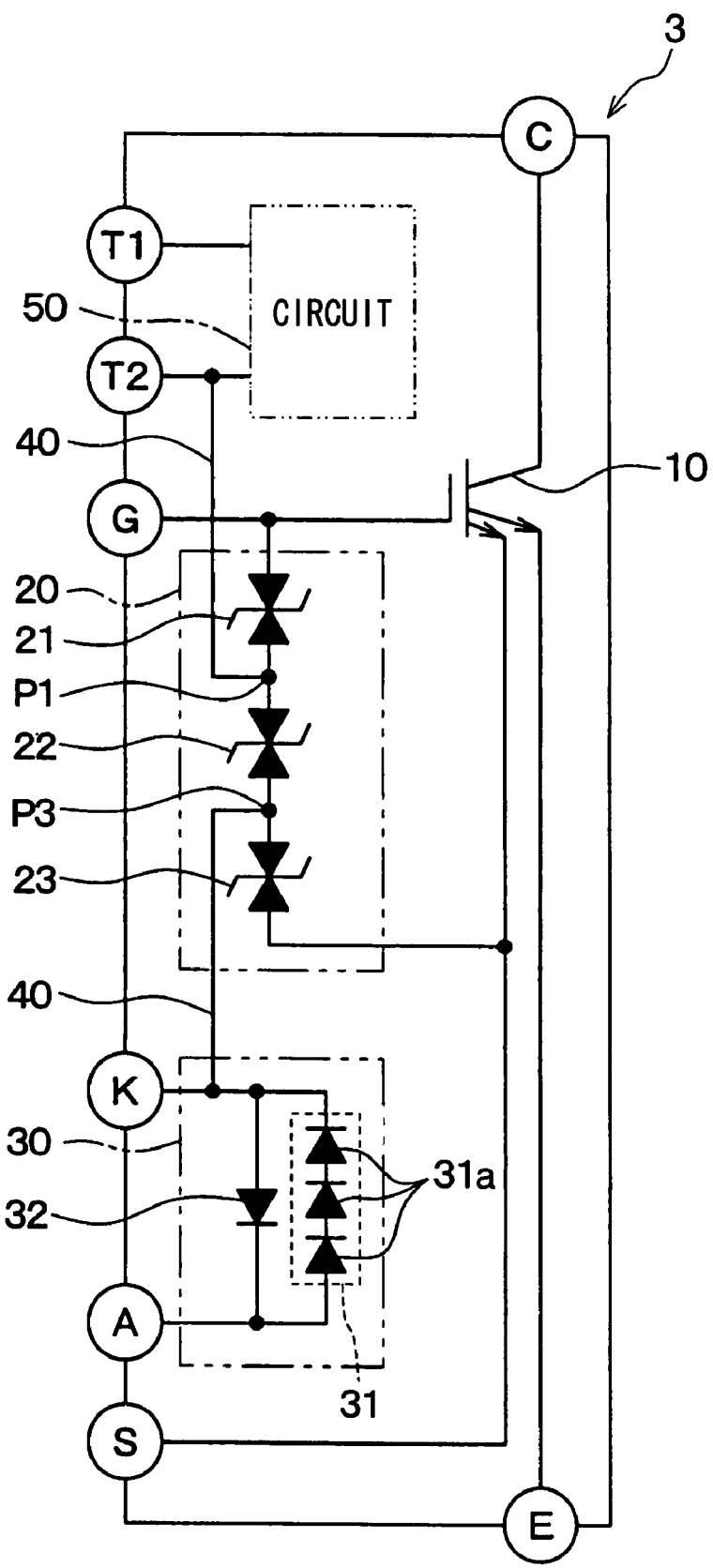
FIG. 10 is a diagram illustrating a power semiconductor device according to a third embodiment of the present invention.

A power semiconductor device 3 according to a third embodiment of the present invention is described below with reference to FIG. 10. Differences between the power semiconductor devices 1, 3 are as follows:

The power semiconductor device 3 further includes external terminals T1, T2 and a circuit 50 as a peripheral circuit. A protection circuit 20 further includes a zener diode 23. The zener diodes 21, 22, 23 are connected in series.

The circuit 50 is electrically isolated from the IGBT 10. The circuit 50 is connected to the external terminals T1, T2.

The terminals T1, T2 can electrically float with respect to power supply or ground potentials, when the protection circuit 20 is inspected.

The node P1 between the zener diodes 21, 22 is connected to the terminal T2 through a conductor 40. A node P3 between the zener diodes 22, 23 is connected to the cathode terminal K through the conductor 40. Zener voltages of the zener diodes 21-23 are set approximately equal to each other.

When the protection circuit 20 is inspected, the protection circuit 20 is divided in three blocks (i.e., zener diodes 21-23) by using the terminal T2, the gate terminal G, and the cathode terminal K. Thus, the protection circuit 20 is separately inspected by using the terminal T2, the gate terminal G, and the cathode terminal K.

Fourth Embodiment

Figure 11:
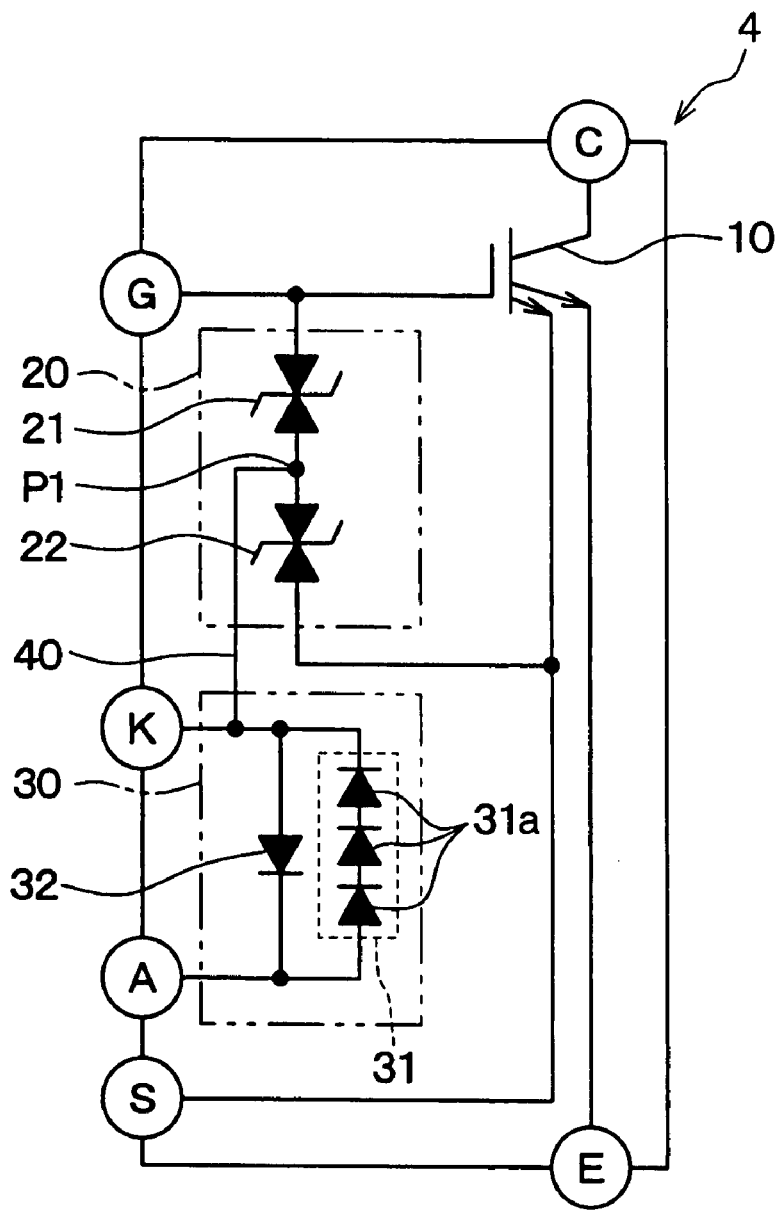
FIG. 11 is a diagram illustrating a power semiconductor device according to a fourth embodiment of the present invention.

A power semiconductor device 4 according to a fourth embodiment of the present invention is described below with reference to FIG. 11. Differences between the power semiconductor devices 1, 4 are as follows:

In a terminal arrangement of the power semiconductor device 1, a conductor connecting the gate electrode of the IGBT 10 and the gate terminal G crosses the conductor 40 connecting the node P1 and the cathode terminal K. The power semiconductor device 4 employs a terminal arrangement that prevents a conductor 40 from crossing other conductors.

The IGBT 10 has first and second emitter electrodes and is constructed as a current mirror circuit. The first and second emitter electrodes of the IGBT 10 are connected to the emitter terminal E and the current sensing terminal S, respectively. The current sensing terminal S is arranged between the gate terminal G and the emitter terminal E. The anode terminal A and the cathode terminal K are arranged between the gate terminal G and the current sensing terminal S. Thus, the gate terminal G, the cathode terminal K, the anode terminal A, the current sensing terminal S, and the emitter terminal E are arranged in the mentioned order. In such an approach, the conductor 40 connecting the node P1 and the cathode terminal K can be prevented from crossing other conductors.

Fifth Embodiment

Figure 12:
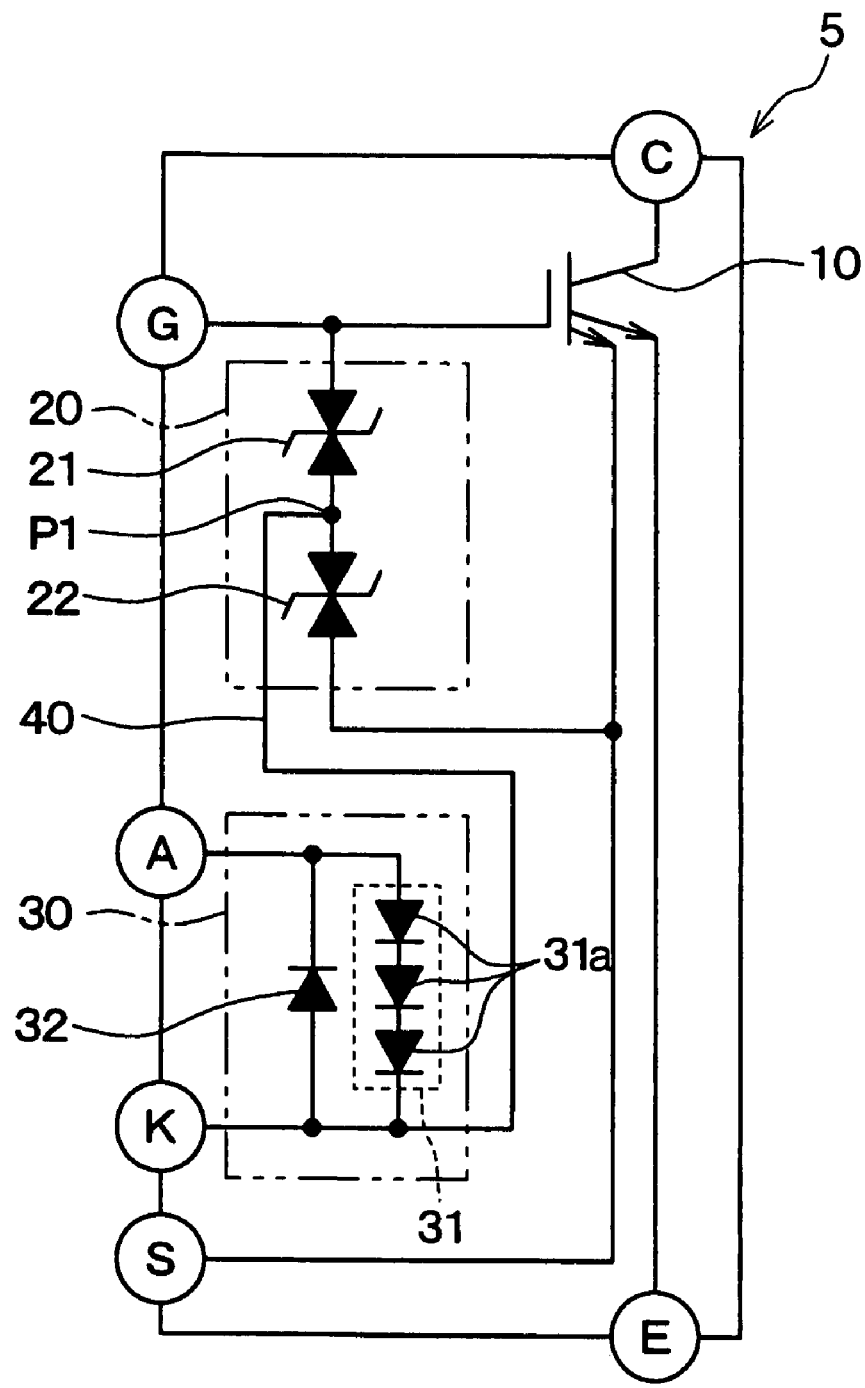
FIG. 12 is a diagram illustrating a power semiconductor device according to a fifth embodiment of the present invention.

A power semiconductor device 5 according to a fifth embodiment of the present invention is described below with reference to FIG. 12. Differences between the power semiconductor devices 4, 5 are as follows:

As described above, in the power semiconductor device 4, the gate terminal G, the cathode terminal K, the anode terminal A, the current sensing terminal S, and the emitter terminal E are arranged in the mentioned order to prevent the conductor 40 from crossing other conductors.

In contrast, in the semiconductor device 5, the gate terminal G, the anode terminal A, the cathode terminal K, the current sensing terminal S, and the emitter terminal E are arranged in the mentioned order to prevent the conductor 40 from crossing other conductors.

Sixth Embodiment

Figure 13:
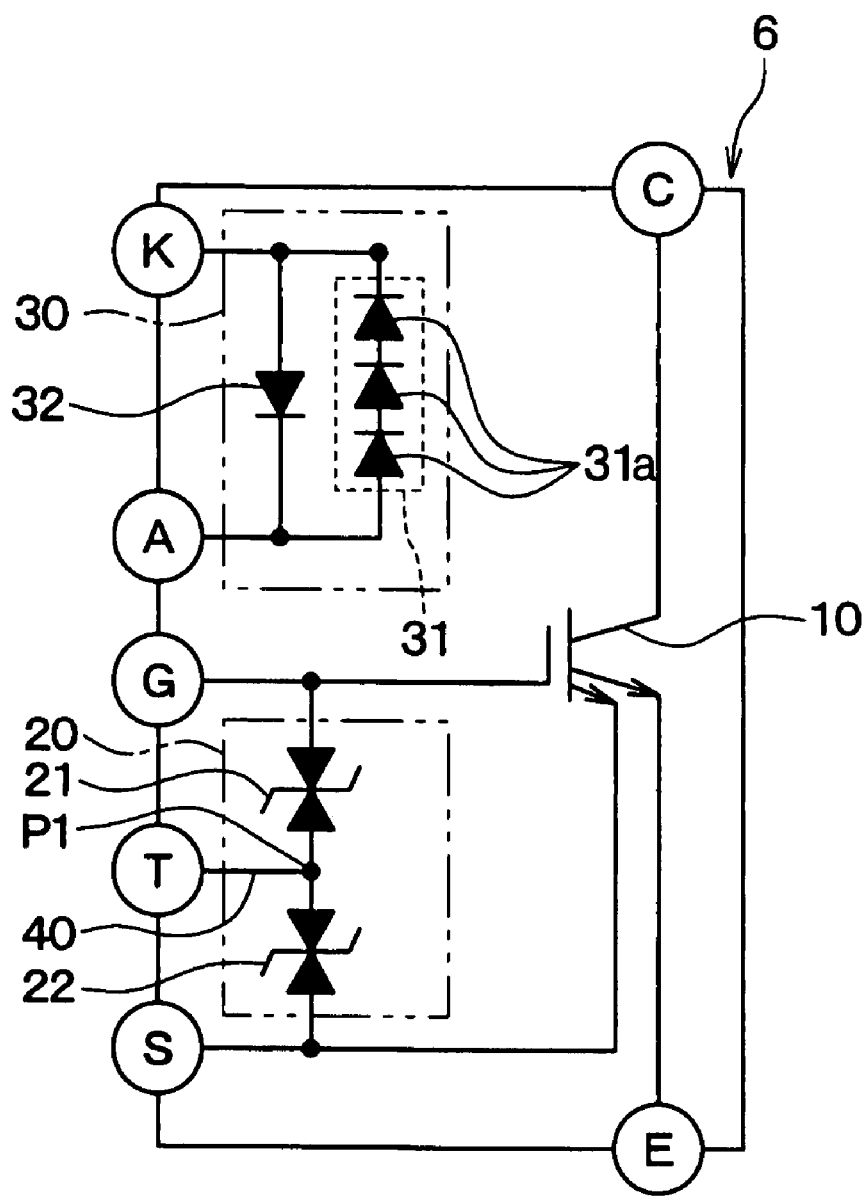
FIG. 13 is a diagram illustrating a power semiconductor device according to a sixth embodiment of the present invention.

A power semiconductor device 6 according to a sixth embodiment of the present invention is described below with reference to FIG. 13. Differences between the power semiconductor devices 1, 6 are as follows:

As described above, in the power semiconductor device 1, the protection circuit 20 is separately inspected by using the cathode terminal K, which is shared with the temperature detection circuit 30.

In contrast, the power semiconductor device 6 includes an inspection terminal T specifically designed for the inspection of the protection circuit 20. The node P1 between the zener diodes 21, 22 of the protection circuit 20 is electrically connected to the inspection terminal T through the conductor 40. Thus, the zener diodes 21, 22 can be separately inspected by using the inspection terminal T.

Seventh Embodiment

Figure 14:
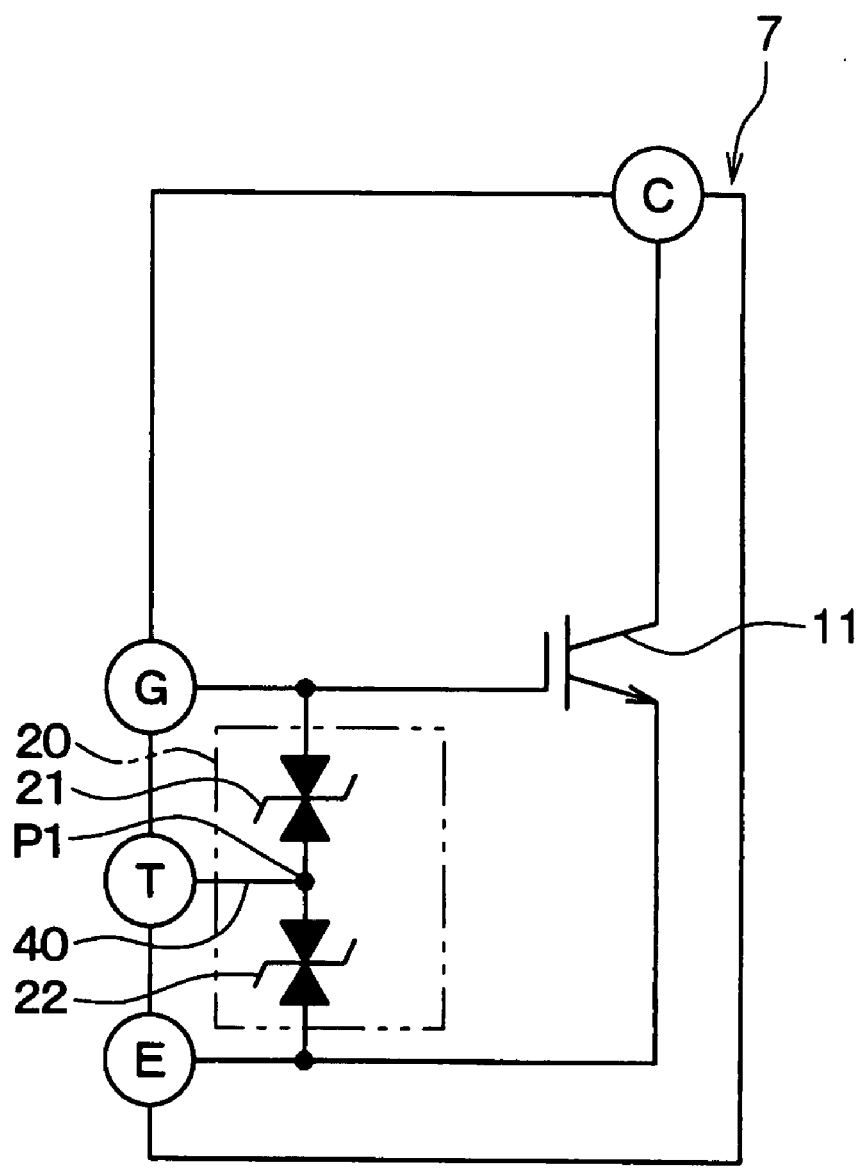
FIG. 14 is a diagram illustrating a power semiconductor device according to a seventh embodiment of the present invention.

A power semiconductor device 7 according to a seventh embodiment of the present invention is described below with reference to FIG. 14. Differences between the power semiconductor devices 6, 7 are as follows:

The power semiconductor device 7 includes an IGBT 11 instead of the IGBT 10. While the IGBT 10 has two emitters, the IGBT 11 has one emitter. The power semiconductor device 7 does not have the temperature detection circuit 30. Accordingly, the power semiconductor device 7 also does not have the cathode terminal K and the anode terminal A.

The emitter electrode of the IGBT 11 is connected to the emitter terminal E. The protection circuit 20 is connected between the gate terminal G and the emitter terminal E. The node P1 between the zener diodes 21, 22 of the protection circuit 20 is electrically connected to the inspection terminal T through the conductor 40. Thus, the zener diodes 21, 22 can be separately inspected by using the inspection terminal T.

Modifications

The embodiments described above may be modified in various ways. For example, other power semiconductor elements such as a power MOSFET may be used instead of the IGBT 10, 11. The protection circuit 20 may be separately inspected by using both the shared terminal (i.e., cathode terminal K) and the specific terminal (i.e., inspection terminal T). The protection circuit 20 can be constructed with circuit elements other than zener diodes. For example, the protection circuit 20 may be constructed with a resistor and a capacitor connected in series with the resistor to form a RC circuit. In this case, a node between the resistor and the capacitor is electrically connected to one of the external terminals, and the resistor and the capacitor of the protection circuit 20 are separately inspected by using the one of the external terminals.

Such changes and modifications are to be understood as being within the scope of the present invention as defined by the appended claims.

What is claimed is:

1. A power semiconductor device comprising:
a power semiconductor element having a gate electrode, a first electrode, and a second electrode, the power semiconductor element allowing a first electric current to flow from the first electrode to the second electrode in accordance with an electrical signal applied to the gate electrode;
a protection circuit that includes a plurality of protection elements connected in series between the gate electrode and the second electrode of the power semiconductor element, the protection circuit limiting a voltage between the gate electrode and the second electrode when an abnormal voltage is applied to the gate electrode;
a first external terminal connected to the gate electrode;
a second external terminal connected to the first electrode;
a third external terminal connected to the second electrode;
a fourth external terminal available to separately inspect the plurality of protection elements of the protection circuit; and
an electrical conductor electrically connecting the fourth external terminal to a node between a first one of the plurality of protection elements and a second one of the plurality of protection elements.

2. The device according to claim 1, further comprising:
a peripheral circuit connected to the fourth external terminal.

3. The device according to claim 2,
wherein the peripheral circuit is a temperature detection circuit for outputting a voltage dependent on a temperature of the power semiconductor device through the fourth external terminal.

4. The device according to claim 3,
wherein the power semiconductor element is configured as a current mirror circuit and has a third electrode for outputting a second electric current proportional to the first electric current flowing through the second electrode, and
wherein the protection circuit is connected between the gate electrode and the third electrode to limit a voltage between the gate electrode and the third electrode when the abnormal voltage is applied to the gate electrode.

5. The device according to claim 4, further comprising;
a fifth external terminal connected to the third electrode of the power semiconductor element,
wherein the fifth external terminal is arranged between the first and third external terminals, and
wherein the fourth external terminal is arranged between the first and fifth external terminals.

6. The device according to claim 1,
wherein the conductor is a portion of a metal member connecting the power semiconductor element to the plurality of protection elements or is a portion of a polysilicon member forming a gate wiring of the power semiconductor element.

7. The device according to claim 1,
wherein the plurality of protection elements includes at least one zener diode.

8. The device according to claim 7,
wherein each of the plurality of protection elements is a zener diode.

9. The device according to claim 8,
wherein each zener diode has a substantially same zener voltage.

10. The device according to claim 7,
wherein the plurality of protection elements includes at least two zener diodes and at least one resistor connected in series between the zener diodes,
wherein a first one of the zener diodes has a first zener voltage,
wherein a second one of the zener diodes has a second zener voltage less than the first zener voltage, and
wherein the conductor connects the fourth external terminal to the node between the first one of the zener diodes and the resistor.

11. The device according to claim 7,
wherein the plurality of protection elements includes at least two zener diodes and at least one resistor connected in series between the zener diodes,
wherein a first one of the zener diodes has a first zener voltage, wherein a second one of the zener diodes has a second zener voltage greater than the first zener voltage, and wherein the conductor connects the fourth external terminal to the node between the second one of the zener diodes and the resistor.

12. The device according to claim 8, wherein when an screening inspection is conducted to inspect an electrical isolation of an gate oxide film of the power semiconductor element, a screening voltage less than the sum of zener voltages of the zener diodes is applied to the gate electrode of the power semiconductor element.

13. The device according to claim 1, wherein the fourth external terminal is specialized to separately inspect the plurality of protection elements of the protection circuit.

\* \* \* \* \*